(12) United States Patent
Chih et al.

(10) Patent No.: US 10,947,414 B2
(45) Date of Patent: Mar. 16, 2021

(54) COMPOSITIONS FOR USE IN CHEMICAL MECHANICAL POLISHING

(71) Applicant: Taiwan Semiconductor Manufacturing Co., Ltd., Hsinchu (TW)

(72) Inventors: Fang-I Chih, Tainan (TW); Chih-Chieh Chang, Zhubei (TW); Hui-Chi Huang, Zhubei (TW); Kei-Wei Chen, Tainan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/503,255

(22) Filed: Jul. 3, 2019

(65) Prior Publication Data

US 2020/0040221 A1 Feb. 6, 2020

Related U.S. Application Data

(60) Provisional application No. 62/712,905, filed on Jul. 31, 2018.

(51) Int. Cl.
| | | |
|---|---|---|
| *C09G 1/02* | (2006.01) | |
| *B24B 37/20* | (2012.01) | |
| *C09G 1/04* | (2006.01) | |
| *H01L 21/306* | (2006.01) | |
| *H01L 21/321* | (2006.01) | |

(52) U.S. Cl.
CPC ............... *C09G 1/02* (2013.01); *B24B 37/20* (2013.01); *C09G 1/04* (2013.01); *H01L 21/30625* (2013.01); *H01L 21/3212* (2013.01)

(58) Field of Classification Search
CPC ....... C09G 1/02; C09G 1/04; H01L 21/30625; H01L 21/3212; B24B 37/20
USPC ............................ 438/690–693; 51/307, 308
See application file for complete search history.

(56) References Cited

U.S. PATENT DOCUMENTS

| | | | | |
|---|---|---|---|---|
| 2002/0055323 | A1* | 5/2002 | McClain | B24B 57/02 451/41 |
| 2008/0026583 | A1* | 1/2008 | Hardy | C09G 1/02 438/693 |
| 2009/0081927 | A1* | 3/2009 | Grumbine | C09G 1/02 451/36 |
| 2017/0154787 | A1* | 6/2017 | Sakashita | B24B 37/044 |

* cited by examiner

*Primary Examiner* — Duy Vu N Deo
(74) *Attorney, Agent, or Firm* — Seed IP Law Group LLP (57) ABSTRACT

A polishing composition for a chemical mechanical polishing process includes abrasive particles, at least one chemical additive, and a non-aqueous solvent.

20 Claims, 10 Drawing Sheets

COMPOSITIONS FOR USE IN CHEMICAL MECHANICAL POLISHING

PRIORITY CLAIM AND CROSS-REFERENCE

This application claims the benefit of U.S. Provisional Patent Application No. 62/712,905, filed Jul. 31, 2018, which is incorporated by reference herein.

BACKGROUND

Chemical mechanical polishing (CMP) is widely used in the fabrication of integrated circuits to remove the surface irregularities of conductive or dielectric materials on semiconductor wafers, thereby providing a leveled surface for subsequent fabrication steps. During a CMP process, a workpiece, such as a semiconductor wafer, is brought into physical contact with a rotating polishing pad while a polishing composition, also referred to as CMP slurry, is introduced on to the workpiece. The rotating polishing pad and the CMP slurry together remove material from the workpiece until the workpiece has a flat or planar surface. A typical CMP slurry is an aqueous suspension comprised of abrasive particles dispersed in an aqueous medium (e.g., deionized water).

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions and spatial relationship(s) of the various features may be arbitrarily enlarged or reduced for clarity. Like reference numerals denote like features throughout specification and drawings.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits contain numerous devices such as transistors, diodes, capacitors and resistors that are fabricated on and/or in a semiconductor substrate. These devices are initially isolated from one another and are later interconnected to form functional circuits. As device densities in integrated circuits increase, multiple wiring levels are required to achieve interconnections of these devices.

In a multilevel interconnect structure, conductive lines (e.g., copper lines) are laid in stacked dielectric layers and are connected through vias from one layer to another layer. The conductive lines and vias are fabricated using single or dual damascene processes in some instances. In such processes, a dielectric layer is patterned to form contact openings including trenches and/or via openings. A barrier layer is deposited along sidewall and bottom surfaces of the contact openings, followed by depositing a conductive material layer over the barrier layer to overfill the contact openings. A CMP process is then performed to remove the conductive material layer and the barrier layer from the top surface of the dielectric layer, while forming conductive lines and vias in the dielectric layer. The process is repeated to form a series of stacked conductive lines which are electrically coupled by vias.

The conductive material layer includes a low resistivity metal such as copper (Cu), aluminum (Al), tungsten (W), or cobalt (Co). The barrier layer typically includes a refractory metal and/or a refractory metal nitride, such as titanium (Ti), tantalum (Ta), ruthenium (Ru), titanium nitride (TiN), tantalum nitride (TaN), or tungsten nitride (WN). The barrier layer is provided to prevent diffusion of the conductive metal into the dielectric layer and/or to enhance the adhesion of the conductive metal to the dielectric layer. During the CMP process, when both conductive material layer and the barrier layer are exposed to an aqueous polishing slurry, galvanic corrosion of the conductive metal occurs at the interface between the conductive metal and the barrier metal. The term galvanic corrosion used herein refers to a phenomenon in which a metal having a lower potential is corroded when dissimilar metals that differ in potentials are brought into contact with each other in a water-containing electrolyte. In particular, because conductive metal and barrier metal used for formation of interconnect structure possess different redox potentials, when these two metals are in electrical contact, in the presence of a water-containing electrolyte, the conductive metal which has a relatively low redox penitential is oxidized by the barrier metal which has a relatively high redox penitential. The galvanic corrosion of the conductive metal causes pitting or dishing of the metal surface, which increases the irregularity of the metal surface. The surface irregularity adversely affects device interconnect reliability because the upper level interconnect structure formed over the irregular metal surface has turns or bends which conform to the surface irregularity. These bends or turns can cause current crowding in the interconnect structure. Moreover, because water in the CMP slurry is easily dissociated into hydrogen and hydroxide ions, the hydrogen and hydroxide ions tend to diffuse through interfaces between an upper level interconnect structure and the dielectric layer around the upper level interconnect structure to reach an underlying lower level interconnect structure. The galvanic corrosion to the lower level interconnect structure thus occurs during a CMP process for formation of the upper level interconnect structure by static etching, i.e., etching of a metal in the absence of mechanical abrasion. Galvanic corrosion of the lower interconnect structure leads to interconnect failure and/or manufacturing yield loss.

To help to reduce or eliminate galvanic corrosion, in some embodiments, a non-aqueous solvent is used as a dispersing medium in a CMP slurry that is usable for removing excess conductive and barrier metals in formation of a multilevel interconnect structure. Because the non-aqueous solvent has a lower conductivity than water, using the non-aqueous solvent in the CMP slurry helps to reduce or eliminate the galvanic corrosion of the conductive metal by the barrier metal in the presence of the CMP slurry. As a result, the manufacturing yield and reliability of the integrated circuits are increased.

The CMP slurry of the present disclosure includes abrasive particles dispersed in a non-aqueous solvent. In some embodiments, the CMP slurry is substantially free of water. In some embodiments, the CMP slurry further includes one or more chemical additives, such as an oxidizing agent, a chelating agent, a corrosion inhibitor, or a pH adjusting agent. The chemical additives help to provide proper modification of metal surfaces to be polished, which helps to improve polishing efficiency.

The abrasive particles mechanically polishes the surfaces of metals. Examples of abrasive particles include, but are not limited to, silica ($SiO_2$), alumina ($Al_2O_3$), ceria ($CeO_2$), titania ($TiO_2$), zirconia ($ZrO_2$), magnesia (MgO), and manganese oxide ($MnO_2$). In some embodiments, the CMP slurry includes a single type of abrasive particles. In some embodiments, the CMP slurry includes a mixture of two or more types of abrasive particles. For example, in some embodiments, the CMP slurry includes some abrasive particles that are $CeO_2$, and some abrasive particles that are $SiO_2$ or $Al_2O_3$. In some embodiments, to help to obtain good dispersion stability and to minimize the occurrence of scratches, the CMP slurry includes colloidal $SiO_2$, colloidal $Al_2O_3$, colloidal $CeO_2$, or combinations thereof.

To help to obtain a favorable polishing rate, the abrasive particles are provided to have an average particle size (e.g., average particle diameter) of about 20 nanometer (nm) to about 500 nm. If the size of the abrasive particles is too small, polishing rate becomes too low for CMP to be effective. If the size of the abrasive particles is too great, the chance of generating defects on the substrate surfaces due to scratching is increased. In some embodiments, the CMP slurry includes abrasive particles of similar sizes. In some implementations, the CMP slurry include a mixture of abrasive particles of different sizes. For example, in some embodiments, the CMP slurry includes some abrasive particles that have sizes clustered around a smaller value, e.g., less than about 50 nm, and other abrasive particles that have sizes clustered around a larger value, e.g., about 100 nm or more.

The CMP slurry includes any suitable amount of abrasive particles. In some embodiments, the CMP slurry includes about 10 wt. % or less of abrasive particles. In some embodiments, the CMP slurry includes about 0.01 wt. % to about 10 wt. % of abrasive particles. The higher wt. % of the abrasive particles in the CMP slurry normally provides a greater polishing rate. However, if the concentration of the abrasive particles is too high, abrasive particles agglomerate into large particles that fall out of the solution, rendering the CMP slurry unusable for polishing. Thus, the concentration of abrasive particles in the polishing slurry is set to be as high as practical without causing agglomeration of abrasive particles.

The non-aqueous solvent includes any polar organic solvent this is miscible with water and other slurry components. In some embodiments, the non-aqueous solvent that is suitable to be employed as a dispersing medium in the CMP slurry of the present disclosure has a flash point from about 30° C. to about 250° C., a boiling point from 80° C. to about 500° C., and a vapor pressure up to 2.3 kPa at 200° C. In some embodiments, the non-aqueous solvent includes at least one solvent selected from glycols, glycerins, and sulfoxides such as dimethyl sulfoxide (DMSO). In some embodiments, the non-aqueous solvent includes glycols such as ethylene glycol, propylene glycol, diethylene glycol, dipropylene glycol, triethylene glycol, or tripropylene glycol. In some embodiments, the non-aqueous solvent is a derivative of a glycol. Examples of glycol derivatives include glycol monoethers such as ethylene glycol monomethyl ether, propylene glycol monomethyl ether, diethylene glycol monomethyl ether, dipropylene glycol monomethyl ether, triethylene glycol monomethyl ether, tripropylene glycol monomethyl ether, ethylene glycol monoethyl ether, propylene glycol monoethyl ether, diethylene glycol monoethyl ether, dipropylene glycol monoethyl ether, triethylene glycol monoethyl ether, tripropylene glycol monoethyl ether, ethylene glycol monopropyl ether, propylene glycol monopropyl ether, diethylene glycol monopropyl ether, triethylene glycol monopropyl ether, tripropylene glycol monopropyl ether, ethylene glycol monobutyl ether, propylene glycol monobutyl ether, diethylene glycol monobutyl ether, tripropylene glycol monobutyl ether, triethylene glycol monobutyl ether and tripropylene glycol monobutyl ether; glycol ethers such as ethylene glycol dimethyl ether, propylene glycol dimethyl ether, diethylene glycol dimethyl ether, dipropylene glycol dimethyl ether, triethylene glycol dimethylethyl ether, tripropylene glycol dimethyl ether, ethylene glycol diethyl ether, propylene glycol diethyl ether, diethylene glycol diethyl ether, dipropylene glycol diethyl ether, triethylene glycol diethyl ether, tripropylene glycol diethyl ether, ethylene glycol dipropyl ether, propylene glycol dipropyl ether, diethylene glycol dipropyl ether, dipropylene glycol dipropyl ether, triethylene glycol dipropyl ether, tripropylene glycol dipropyl ether, ethylene glycol dibutyl ether, propylene glycol dibutyl ether, diethylene glycol dibutyl ether, dipropylene glycol dibutyl ether, tripropylene glycol dibutyl ether and tripropylene glycol dibutyl ether; and glycol esters such as ethylene glycol monomethyl ether acetate, diethylene glycol monoethyl ether acetate and propylene glycol monomethyl ether acetate.

Optionally, an oxidizing agent is incorporated into the CMP slurry to facilitate efficient removal and better planarization. The oxidizing agent promotes oxidation of metals in the barrier layer and the conductive material layer to corresponding metal oxides, and the metal oxides are subsequently removed by mechanical grinding. For example, an oxidizing agent is used to oxidize tungsten to tungsten oxide; thereafter, the tungsten oxide is mechanically polished and removed. As a further example, the oxidizing agent is able to oxidize copper to cuprous oxide or cupric oxide; thereafter, the cuprous oxide or cupric oxide is mechanically polished and removed. Examples of oxidizing agents include, but are not limited to, hydrogen peroxide, peroxosulfates, nitric acid, potassium periodate, hypochlorous acid, ozone, ferric nitrate ($Fe(NO_3)_3$), potassium nitrate $KNO_3$), and combinations thereof. If present, the CMP slurry includes any suitable amount of oxidizing agent to ensure rapid oxidation of the metal layer while balancing the CMP performance. In some embodiments, the CMP slurry includes about 10 wt. % or less of oxidizing agent. In some embodiments, the CMP slurry includes about 0.01 wt. % to about 10 wt. % of oxidizing agent. When no oxidizing agent is present, the metal surfaces are oxidized by the ambient atmosphere to form natural metal oxides to be subsequently removed.

Optionally, a chelating agent is incorporated into the CMP slurry to improve the planarization or polishing of metal surfaces. The chelating agent is capable of forming a complex compound with metal ions, e.g., Cu or W ions, so that oxidized metal is able to be removed from the metal surfaces being polished. Examples of chelating agent include, but are not limited to, inorganic acids such as phosphoric acid, organic acids such as acetic acid, oxalic acid, malonic acid, tartaric acid, citric acid, maleic acid, phthalic acid, or succinic acid, and amines such as ethanol amine or propanol amine. If present, the CMP slurry includes any suitable amount of chelating agent. In some embodiments, the CMP slurry includes about 10 wt. % or less of chelating agent. In some embodiments, the CMP slurry includes about 0.01 wt. % to about 10 wt. % of chelating agent.

Optionally, a corrosion inhibitor is incorporated into the CMP slurry to help to prevent corrosion of metals during the CMP processes. Examples of corrosion inhibitors include, but are not limited to, pyridines and azoles. Examples of pyridines include 1H-1,2,3-triazolo[4,5-b]pyridine, 1-acetyl-1H-1,2,3-triazolo[4,5-b]pyridine, 3-aminopyridine, 4-aminopyridine, 3-hydroxypyridine, 4-hydroxypyridine, 2-acetoamidopyridine, 4-pyrrolidinopyridine, and 2-cyanopyridine. Examples of azoles include pyrazoles such as pyrazole, 1-allyl-3,5-dimethylpyrazole, 3,5-di(2-pyridyl) pyrazole, 3,5-diisopropylpyrazole, 3,5-dimethyl-1-hydroxymethylpyrazole, 3,5-dimethyl-1-phenylpyrazole, 3,5-dimethylpyrazole, 3-amino-5-hydroxypyrazole, 4-methylpyrazole, N-methylpyrazole, 3-aminopyrazole and 4-aminopyrazole; imidazoles such as 1,1'-carbonylbis-1H-imidazole, 1,1'-oxalyldiimidazole, 1,2,4,5-tetramethylimidazole, 1,2-dimethyl-5-nitroimidazole, 1,2-dimethylimidazole, 1-(3-aminopropyl)imidazole, 1-butylimidazole, 1-ethylimidazole and 1-methylimidazole; thiazoles such as 2,4-dimethylthiazole; benzothiazoles such as 2-mercaptobenzothiazole; tetrazoles such as tetrazole, 5-methyltetrazole, 5-aminotetrazole, 1,5-pentamethylenetetrazole and 1-(2-dimethylaminoethyl)-5-mercaptotetrazole; triazoles such as 1,2,3-triazole, 1,2,4-triazole and 3-amino-1,2,4-triazole; and benzotriazoles such as benzotriazole, 1-hydroxybenzotriazole, 1-dihydroxypropylbenzotriazole, 2,3-dicarboxypropylbenzotriazole, 4-hydroxybenzotriazole, 4-carboxybenzotriazole and 5-methylbenzotriazole. In some embodiments, the corrosion inhibitor includes a material the same as the chelating agent. If present, the CMP slurry includes any suitable amount of corrosion inhibitor. In some embodiments, the CMP slurry includes 10 wt. % or less of corrosion inhibitor. In some embodiments, the CMP slurry includes about 0.01 wt. % to about 10 wt. % of corrosion inhibitor.

Optionally, a pH adjusting agent is incorporated in the CMP slurry to maintain a pH level of the CMP slurry in a range from about 2 to about 11. The pH of the CMP varies depending upon the metals be polished. For example, the pH of the CMP slurry is from about 2 to 7 for polishing tungsten and aluminum, while the pH of the CMP slurry is set to be from about 7 to 11 for polishing copper, cobalt and ruthenium. In some embodiments, acids such as hydrochloric acid, nitric acid, sulfuric acid, acetic acid, tartaric acid, succinic acid, citric acid, malic acid, malonic acid, various fatty acids, various polycarboxylic acids are employed to lower the pH of the CMP slurry. In some embodiments, bases such as potassium hydroxide (KOH), ammonium hydroxide ($NH_4OH$), trimethyl amine (TMA), triethyamine (TEA), and tetramethylammounium hydroxide (TMAH) are employed to increase pH of the CMP slurry. If present, the CMP slurry includes any suitable amount of the pH adjusting agent. In some embodiments, the CMP slurry includes 10 wt. % or less of pH adjusting agent. In some embodiments, the CMP slurry includes about 0.01 wt. % to about 10 wt. % of pH adjusting agent.

One skilled in the art would understand that certain aforementioned compounds are capable of performing more than one function. For example, some compounds such as organic acids are capable of functioning as an oxidizing agent, a chelating agent, as well as a pH adjusting agent.

In some embodiments, the CMP slurry of the present disclosure is prepared by mixing the components described herein together. The components used in a CMP slurry are able to be mixed together in any order.

Figure 1:
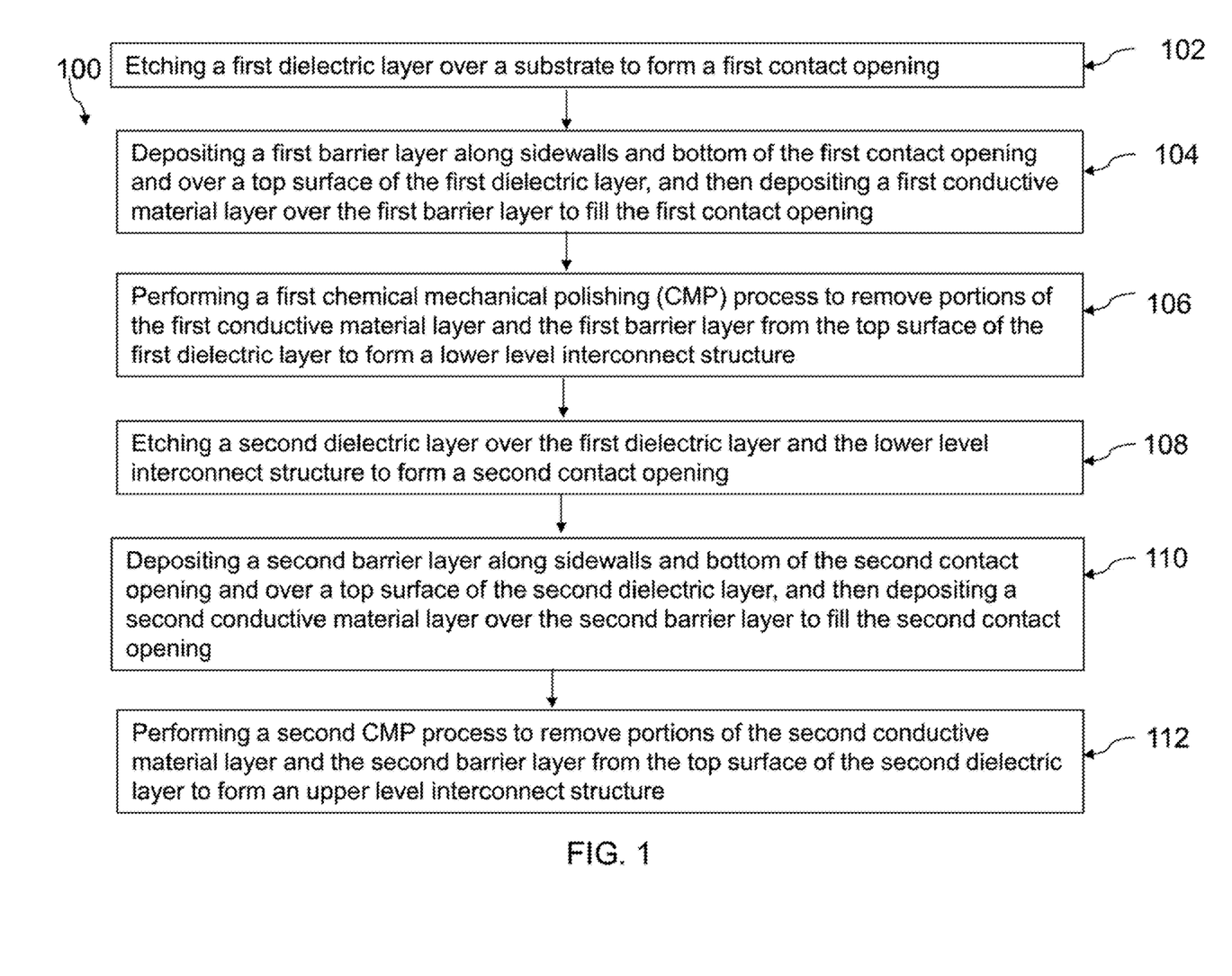
FIG. 1 is a flowchart of a method of fabricating a semiconductor structure, in accordance with some embodiments.

FIG. 1 is a flowchart of a method 100 of fabricating a semiconductor structure 200, in accordance with some embodiments. FIGS. 2A-2F are cross-sectional views of the semiconductor structure 200 in various stages of the method 100, in accordance with some embodiments. The method 100 is discussed in detail below, with reference to the semiconductor structure, in FIGS. 2A-2F. In some embodiments, additional operations are performed before, during, and/or after the method 100, or some of the operations described are replaced and/or eliminated. In some embodiments, additional features are added to the semiconductor structure 200. In some embodiments, some of the features described below are replaced or eliminated. One of ordinary skill in the art would understand that although some embodiments are discussed with operations performed in a particular order, these operations may be performed in another logical order.

Figure 2A:
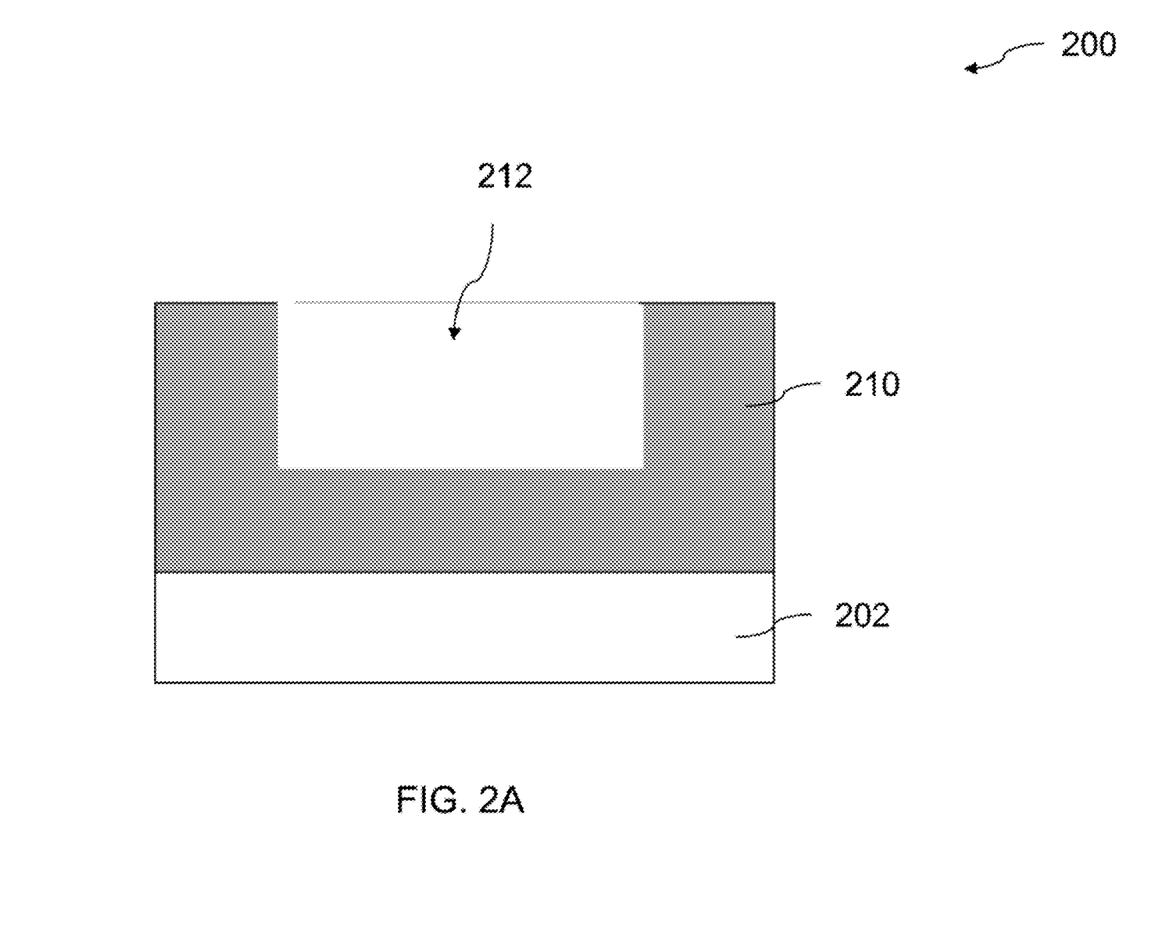
FIG. 2A-2F are cross-sectional views of a semiconductor structure in various stages of the method of FIG. 1, in accordance with some embodiments.

Referring to FIGS. 1 and 2A, the method 100 includes operation 102, in which a first dielectric layer 210 over a substrate 202 is etched to form a first contact opening 212. FIG. 2A is a cross-sectional view of a semiconductor structure 200 after etching the first dielectric layer 210 to form the first contact opening 212.

In some embodiments, the substrate 202 is a bulk semiconductor substrate including silicon. Alternatively or additionally, in some embodiments the bulk semiconductor substrate includes another elementary semiconductor such as germanium, a compound semiconductor including gallium arsenide, gallium, phosphide, indium phosphide, indium arsenide, and/or indium antimonide, an alloy semiconductor including SiGe, GaAsP, AlInAs, AlGaAs, GaInAs, GaInP, and/or GaInAsP; or combinations thereof. In some embodiments, the substrate 202 includes an epitaxial layer. For example, the substrate 202 has an epitaxial layer overlying a bulk semiconductor substrate. Furthermore, in some embodiments, the substrate 202 is a semiconductor on insulator (SOI) substrate. For example, the substrate 202 includes a buried oxide (BOX) layer formed by a process such as separation by implanted oxygen (SIMOX) or other suitable techniques, such as wafer bonding and grinding.

In some embodiments, the substrate 202 further includes active devices such as p-type field effect transistors (PFET), n-type FET (NFET), metal-oxide semiconductor (MOS) transistors, complementary metal-oxide semiconductor (CMOS) transistors, bipolar transistors, high voltage transistors, and/or high frequency transistors. In some embodiments, the transistors are planar transistors or three-dimensional fin-type transistors. In some embodiments, the substrate 202 further includes passive devices such as resistors, capacitors, and/or inductors. The substrate 202 further includes isolation structures such as shallow trench isolation (STI) structures to separate various active and/or passive devices from one another.

The first dielectric layer 210 is deposited over the substrate 202. In some embodiments and as in FIG. 2A, the first dielectric layer 210 is deposited directly above and in contact with the substrate 202. In some embodiments, one or more dielectric layers containing contact structures therein are disposed between the first dielectric layer 210 and the substrate 202.

In some embodiments, the first dielectric layer 210 includes silicon oxide. In some embodiments, the first dielectric layer 210 includes a low-k dielectric material having a dielectric constant (k) less than 4. In some embodiments, the low-k dielectric material has a dielectric constant from about 1.2 to about 3.5. In some embodiments, the first dielectric layer 210 includes tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the first dielectric layer 210 is deposited by chemical vapor deposition (CVD), plasma enhanced chemical vapor deposition (PECVD), physical vapor deposition (PVD), or spin coating. In some embodiments, the first dielectric layer 210 is planarized by a planarization process or otherwise recessed to provide a planar top surface. In some embodiments, the top surface of the first dielectric layer 210 is planarized using a CMP process.

The first dielectric layer 210 is subsequently etched to form a first contact opening 212 therein. The first contact opening 212 is a trench opening, a via opening, or a combination of a trench opening and a via opening with the via opening enclosed by the trench opening. In some embodiments and as in FIG. 2B, the first contact opening 212 is a trench opening. Although only a single contact opening is illustrated and described in FIG. 2A, it is understood that any number of contact openings can be formed.

The first dielectric layer 210 is etched with one or more lithography and etching processes. In some embodiments, the lithography process includes applying a photoresist layer (not shown) over the first dielectric layer 210, exposing the photoresist layer to a pattern, performing post-exposure baking, and developing the resist to form a patterned photoresist layer (not shown). The patterned photoresist layer exposes a portion of the first dielectric layer 210 where the first contact opening 212 is to be formed. Next, the portion of the first dielectric layer 210 exposed by the patterned photoresist layer is etched to form the first contact opening 212. In some embodiments, the first dielectric layer 210 is etched using a dry etch such as, for example, a reactive ion etch (RIE) or a plasma etch. In some embodiments, the first dielectric layer 210 is etching using a wet etch. After formation of the first contact opening 212 in the first dielectric layer 210, the patterned photoresist layer is removed, for example, by wet stripping or plasma ashing. Alternatively, in some embodiments, a hard mask is used such that the contact opening pattern is transferred from the pattered photoresist layer to the hard mask by a first etch and then transferred to the first dielectric layer 210 by a second etch.

Figure 2B:
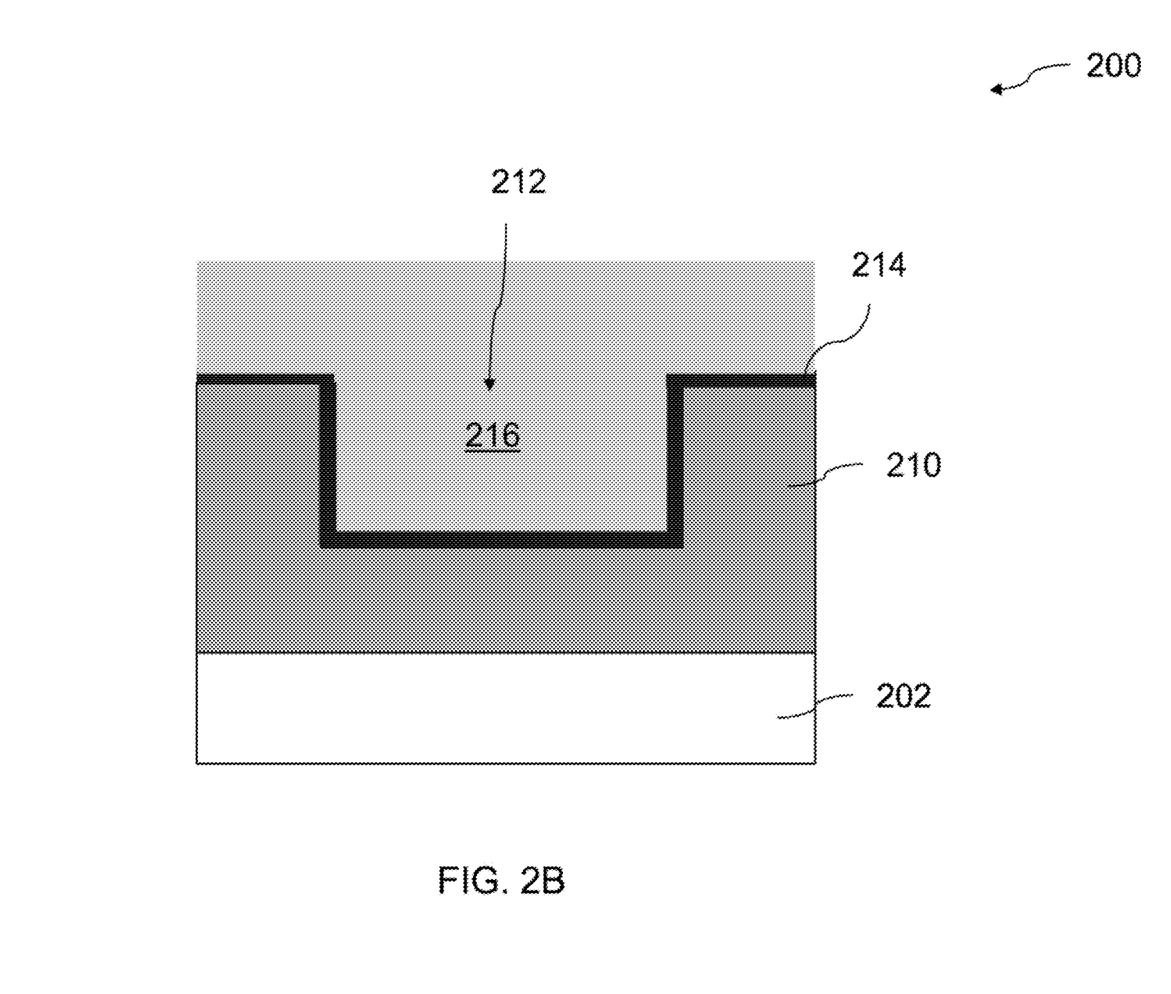

Referring to FIGS. 1 and 2B, the method 100 proceeds to operation 104, in which a first barrier layer 214 is deposited along sidewalls and bottom of the first contact opening 212 and over the top surface of the first dielectric layer 210, followed by depositing a first conductive material layer 216 over the first barrier layer 214 to fill the first opening 212. FIG. 2B is a cross-sectional view of the semiconductor structure 200 of FIG. 2A after depositing the first barrier layer 214 along sidewalls and bottom of the at first contact opening 212 and over the top surface of the first dielectric layer 210, and then depositing the first conductive material layer 216 over the first barrier layer 214 to fill the first contact opening 212.

The first barrier layer 214 includes a diffusion barrier material that prevents the metal in the conductive material layer 216 from diffusing into the first dielectric layer 210. In some embodiments, the first barrier layer 214 includes Ti, Ta, Ru, TiN, TaN, WN, or other suitable diffusion barrier materials. In some embodiments, the first barrier layer 214 includes a stack of the above-mentioned diffusion barrier materials such as, for example, Ti/TiN or Ta/TaN. In some embodiments, the first barrier layer 214 is deposited utilizing a conformal deposition process such as CVD, PECVD, PVD, or atomic layer deposition (ALD).

In some embodiments, the first conductive material layer 216 includes Cu, Al, W, Co, alloys thereof, or other suitable conductive metals. In some embodiments, the first conductive material layer 216 is deposited by a suitable deposition process such as, for example, CVD, PECVD, sputtering, or plating. In some embodiments, especially when Cu or a Cu alloy is employed in the first conductive material layer 216, an optional plating seed layer (not shown) is formed over the first barrier layer 214 prior to the formation of the first conductive material layer 216. In some embodiments, the optional plating seed layer is formed by a deposition process including, for example, CVD, PECVD, ALD, and PVD.

Figure 2C:
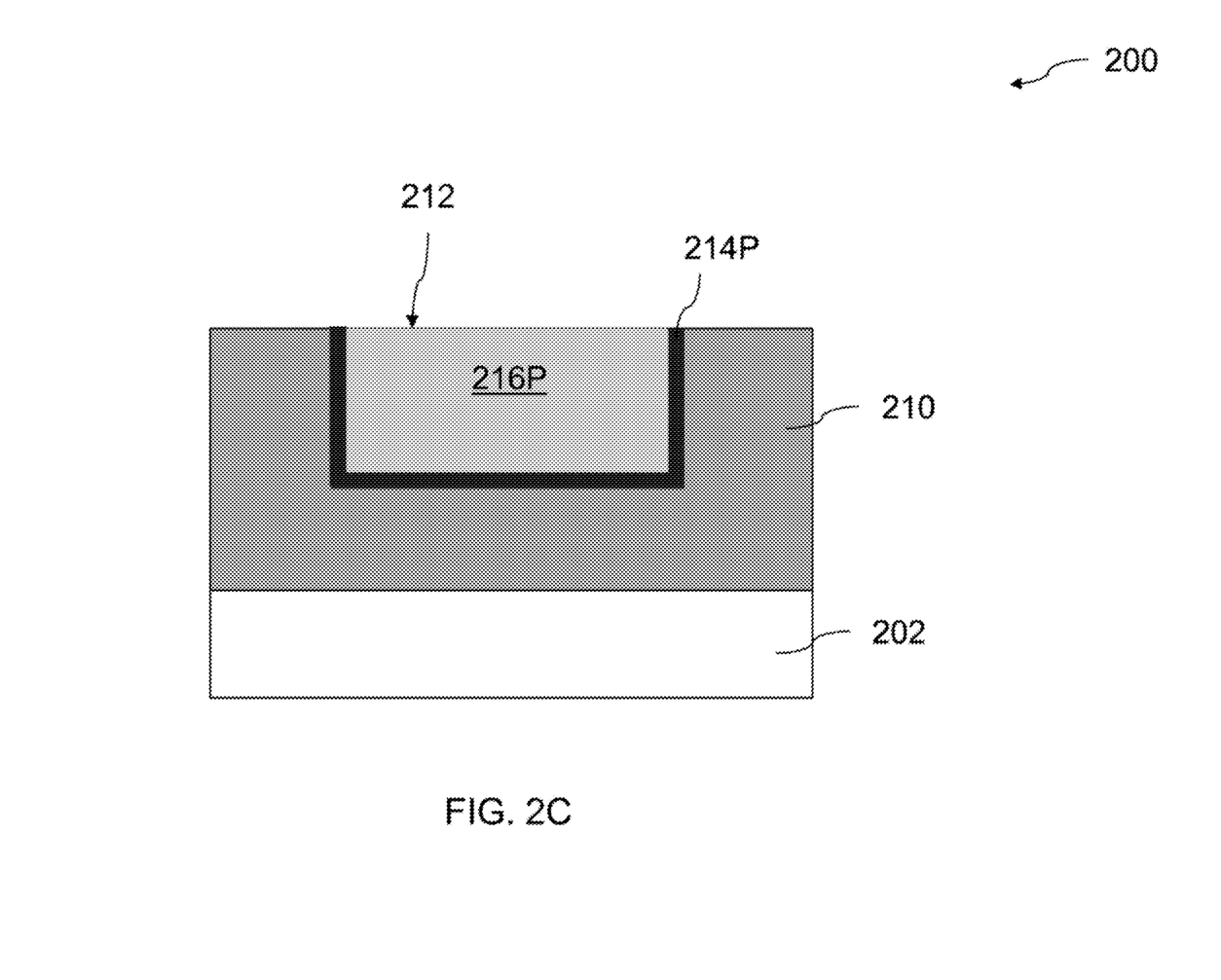

Referring to FIGS. 1 and 2C, the method 100 proceeds to operation 106, in which a first CMP process is performed to remove portions of the first conductive material layer 216 and the first barrier layer 214 from the top surface of the first dielectric layer 210. FIG. 2C is a cross-sectional view of the semiconductor structure 200 of FIG. 2B after removing portions of the first conductive material layer 216 and the first barrier layer 214 from the top surface of the first dielectric layer 210.

A first CMP process is performed using a CMP slurry of the present disclosure. The first CMP process removes portions of the first conductive material layer 216 and the first barrier layer 214 from the top surface of the first dielectric layer 210, so that portions of the first conductive material layer 216 and the first barrier layer 214 in the first contact opening 212 remain. The first CMP process results in a substantially flat surface upon which an upper level interconnect structure is subsequently formed. After the first CMP process, a remaining portion of the first barrier layer 214 on the sidewalls and the bottom of the first contact opening 212 constitutes a first barrier portion 214P, and a remaining portion of the first conductive material layer within the first contact opening 212 constitutes a first conductive portion 216P. The top surfaces of the first barrier portion 214P and the first conductive portion 216P are coplanar with the top surface of the first dielectric layer 210. The first barrier portion 214P and the first conductive portion 216P that is surrounded by the first barrier portion 214P together define a lower level interconnect structure (214P, 216P).

In the present disclosure, a non-aqueous solvent rather than water is used as a dispersing medium in the CMP slurry. Because the non-aqueous solvent has a lower conductivity than water, when the non-aqueous CMP slurry of the present disclosure is employed to polish the first barrier layer 214 and the first conductive material layer 216, corrosion of the conductive metal induced by the galvanic reaction between the conductive metal and barrier metal in the presence of water in other CMP processes using aqueous CMP slurries is reduced or eliminated. The CMP slurry of the present disclosure thus helps to enhance the planarity of the resulting lower level interconnect structure (214P, 216P), which helps to reduce defect formation in additional processing.

Subsequently, a first post-CMP cleaning process is subsequently performed by applying a cleaning solution to the surfaces of the first barrier portion 214P and the first conductive portion 216P. The cleaning solution is usable to remove contaminants such as residual abrasive particles and/or residual metal oxides from surfaces of the first barrier portion 214P and the first conductive portion 216P. The cleaning solution includes one or more chemicals, such as an oxidizing agent, a chelating agent, a corrosion inhibitor, and a pH adjusting agent, in a non-aqueous solvent, so that the cleaning solution is substantially free of water. The non-aqueous solvent helps to prevent or eliminate galvanic corrosion of the first conductive portion 216P during the first post-CMP cleaning process. The exemplary materials for the oxidizing agent, chelating agent, corrosion inhibitor, pH adjusting agent, and non-aqueous solvent are same as those described above with respect to the CMP slurry, and thus are not described in detail here.

Figure 2D:
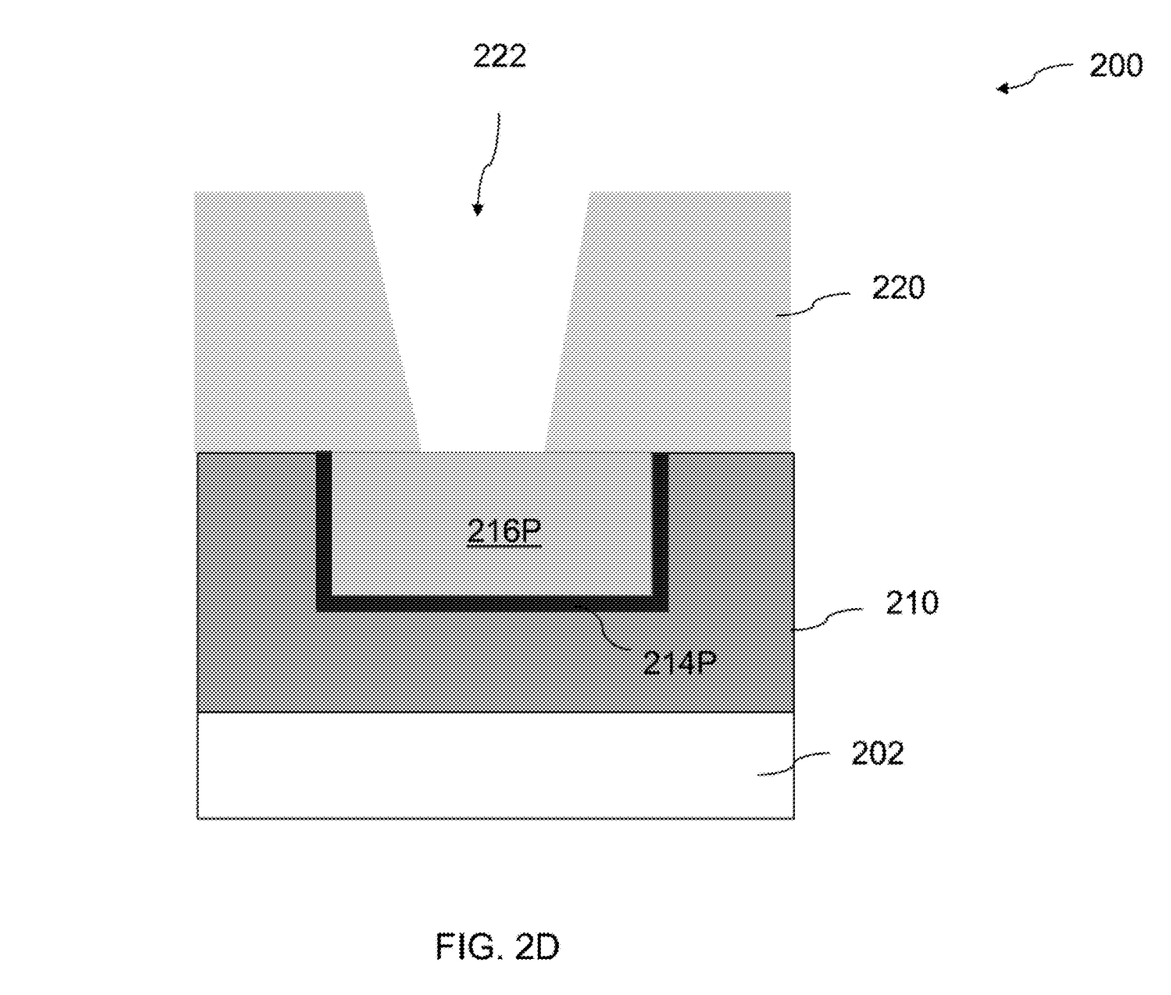

Referring to FIG. 1 and FIG. 2D, the method 100 proceeds to operation 108, in which a second dielectric layer 220 over the first dielectric layer 210 and the lower level contact structure (214P, 216P) is etched to form a second contact opening 222. FIG. 2D is a cross-sectional view of the semiconductor structure 200 of FIG. 2C after etching the second dielectric layer 220 to form the second contact opening 222.

The second dielectric layer 220 is deposited over the first dielectric layer 210 and the lower level contact structure (214P, 216P). The second dielectric layer 220 includes a dielectric material that is the same or different from the dielectric material providing the first dielectric layer 210. For example, the second dielectric layer 220 includes a low-k dielectric material such as TEOS oxide, undoped silicate glass, doped silicate glass such as BPSG, FSG, PSG, or BSG. In some embodiments, the second dielectric layer 230 is deposited using CVD, PECVD, PVD, spin coating, or other suitable deposition process. In some embodiments, the second dielectric layer 220 is planarized by a planarization process or otherwise recessed to provide a planar top surface. In some embodiments, the second dielectric layer 230 is planarized using a CMP process.

The second dielectric layer 220 is subsequently etched to form a second contact opening 222 therein. Although only a single contact opening is illustrated and described in FIG. 2D, it is understood that any number of contact openings 222 can be formed. The second contact opening 222 extends through the second dielectric layer 220, exposing a portion of the first conductive portion 216P in the lower level interconnect structure (214P, 216P). In some embodiments, the second contact opening 222 is a via opening or a combination of a trench opening and a via opening.

In some embodiments, the second contact opening 222 is formed by one or more lithography and etching processes. For example, a photoresist layer (not shown) is first applied over the second dielectric layer 220. The photoresist layer is then patterned to form a patterned photoresist layer (not shown). The patterned photoresist layer expose a portion of the second dielectric layer 220 where the second contact opening 222 to be formed. Next, the portion of the second dielectric layer 220 exposed by the patterned photoresist layer is etched to form the second contact opening 222. In some embodiments, the second dielectric layer 220 is etched using a dry etch such as, for example, RIE or a plasma etch. In some embodiments, the second dielectric layer 220 is etching using a wet etch. After formation of the second contact opening 222, the patterned photoresist layer is removed, for example, by wet stripping or plasma ashing. Alternatively, in some embodiments, a hard mask is used such that the contact opening pattern is transferred from the pattered photoresist layer to the hard mask by a first etch and then transferred to the second dielectric layer 220 by a second etch.

Figure 2E:
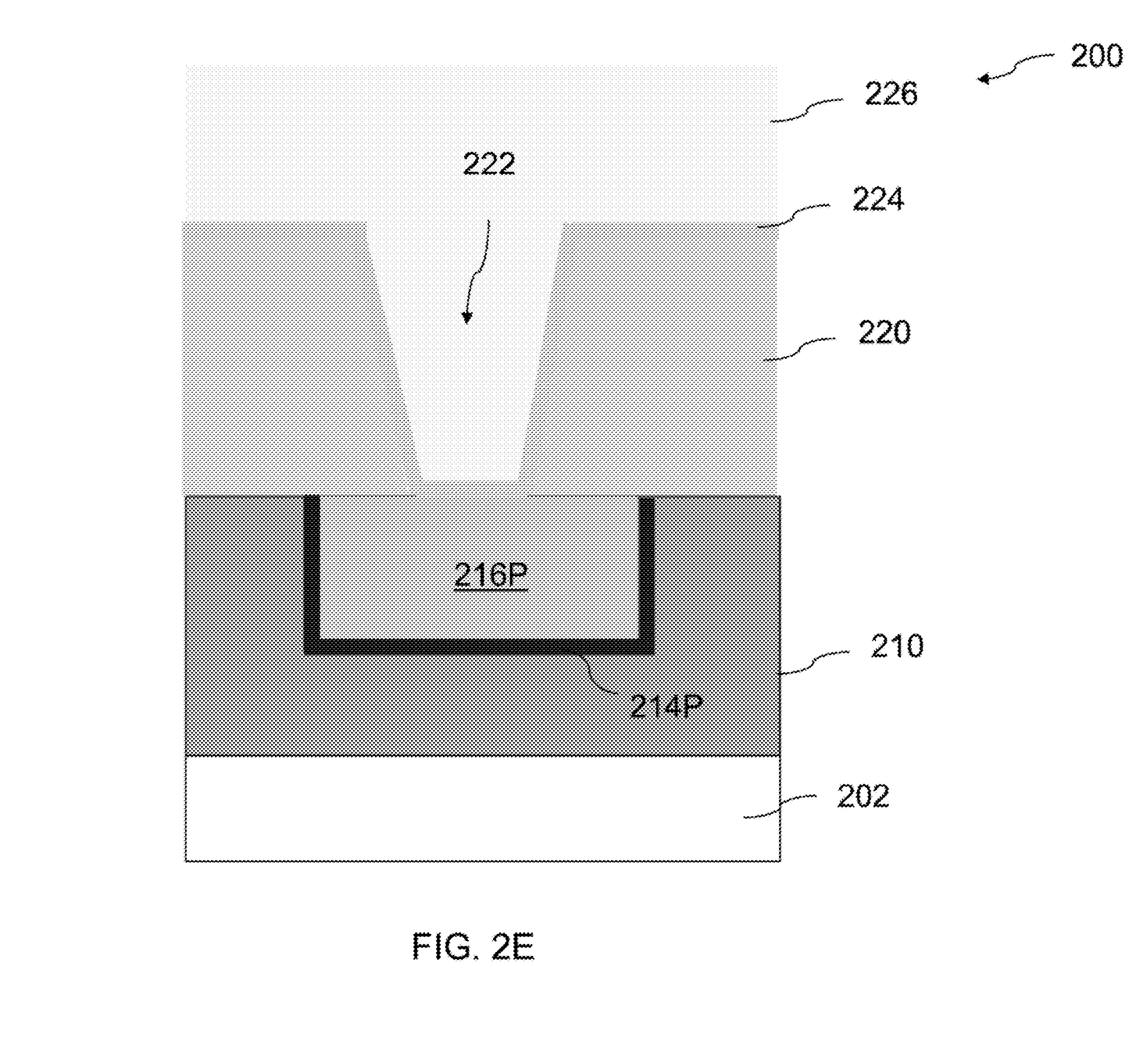

Referring to FIG. 1 and FIG. 2E, the method 100 proceeds to operation 110, in which a second barrier layer 224 is deposited along sidewalls and bottom of the second contact opening 222 and over the top surface of the second dielectric layer 220, followed by depositing a second conductive material layer 226 over the second barrier layer 224 to fill the second contact opening 222. FIG. 2E is a cross-sectional view of the semiconductor structure 200 of FIG. 2D after depositing the second barrier layer 224 along sidewalls and bottom of the second contact opening and over the top surface of the second dielectric layer 220, and then depositing the second conductive material layer 226 over the second barrier layer 224 to fill the second contact opening 222.

The second barrier layer 224 includes a metal the same as, or different from, the first barrier layer 214. In some embodiments, the second barrier layer 224 includes Ti, TiN, Ta, TaN, Ru, WN, or other suitable diffusion barrier materials. In some embodiments, the second barrier layer 224 includes a stack of the above-mentioned diffusion barrier materials such as, for example, Ti/TiN or Ta/TaN. In some embodiments, the second barrier layer 224 is deposited utilizing a conformal deposition process such as CVD, PECVD, PVD, or atomic layer deposition (ALD).

The second conductive material layer 226 includes a metal the same as, or different from, the first conductive material layer 216. In some embodiments, the second conductive material layer 226 includes Cu, Al, W, Co, alloys thereof, or other suitable conductive metals. In some embodiments, the second conductive material layer 226 is deposited by a suitable deposition process such as, for example, CVD, PECVD, sputtering, or plating. In some embodiments, especially when Cu or a Cu alloy is employed in the second conductive material layer 226, an optional plating seed layer (not shown) is formed on the second barrier layer 224 prior to the formation of the second conductive material layer 226. In some embodiments, the optional plating seed layer is formed by a deposition process including, for example, CVD, PECVD, ALD, and PVD.

Figure 2F:
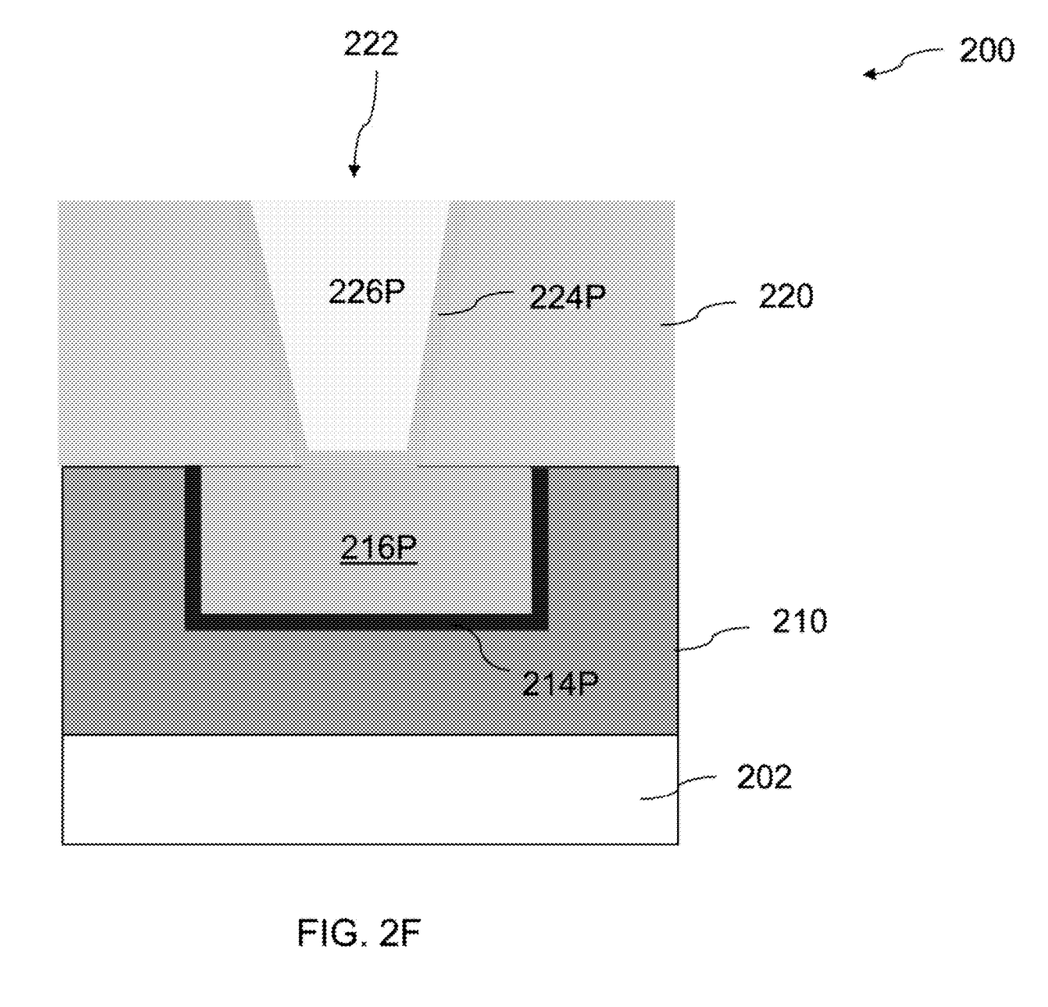

Referring to FIGS. 1 and 2F, the method 100 proceeds to operation 112, in which a second CMP process is performed to remove portions of the second conductive material layer 226 and the second barrier layer 224 from the top surface of the second dielectric layer 220. FIG. 2F is a cross-sectional view of the semiconductor structure 200 of FIG. 2E after removing portions of the second conductive material layer 226 and the second barrier layer 224 from the top surface of the second dielectric layer 220.

A second CMP process is performed using a CMP slurry of the present disclosure. The second CMP process removes portions of the second conductive material layer 226 and the second barrier layer 224 from the top surface of the second dielectric layer 220, so that portions of the second conductive material layer 226 and the second barrier layer 224 in the second contact opening 222 remain. The second CMP results in a substantially flat surface upon which additional processes for fabricating other components of intergrade circuit are performed. After the second CMP process, a remaining portion of the second barrier layer 224 on the sidewalls and the bottom of the second contact opening 222 constitutes a second barrier portion 224P, and a remaining portion of the second conductive material layer 226 within the second contact opening 222 constitutes a second conductive portion 226P. The top surfaces of the second barrier portion 224P and the second conductive portion 226P are coplanar with the top surface of the second dielectric layer 220. The second barrier portion 224P and the second conductive portion 226P that is surrounded by the second barrier portion 224P together define an upper level interconnect structure (224P, 226P).

In the present disclosure, a non-aqueous solvent rather than water is used as a dispersing medium in the CMP slurry. Because the non-aqueous solvent has a lower conductivity than water, when the CMP slurry of the present disclosure is employed to polish the second barrier layer 224 and the second conductive material layer 226, corrosion of the conductive metal induced by the galvanic reaction between the conductive metal and barrier metal in the presence of water in other CMP processes using aqueous CMP slurries is reduced or eliminated. The CMP slurry of the present disclosure thus helps to enhance the planarity of the resulting upper level interconnect structure (224P, 226P), which helps to reduce defect formation in additional processing. Moreover, because the non-aqueous solvent has less tendency than water to dissociate into ions and diffuses through the interface between the second barrier portion 224 and the second dielectric layer 220 to reach the underlying interconnect structures (214P, 216P), the corrosion of the underlying first conductive portion 216P induced by the galvanic reaction between metals in the first conductive portion 216P and the first barrier portion 214P in the presence of solvent ions is reduced or eliminated. As a result, the CMP slurry of the present disclosure helps to enhance the reliability of interconnect structures.

Subsequently, a second post-CMP cleaning process is subsequently performed by applying a cleaning solution described above to the surfaces of the second barrier portion 224P and the second conductive portion 226P. The cleaning solution is usable to remove contaminants such as residual abrasive particles and/or residual metal oxides from surfaces of the second barrier portion 224P and the second conductive portion 226P. The non-aqueous solvent used in the cleaning solution helps to prevent or eliminate galvanic corrosion of the second conductive portion 226P during the second post-CMP cleaning process.

Figure 3:
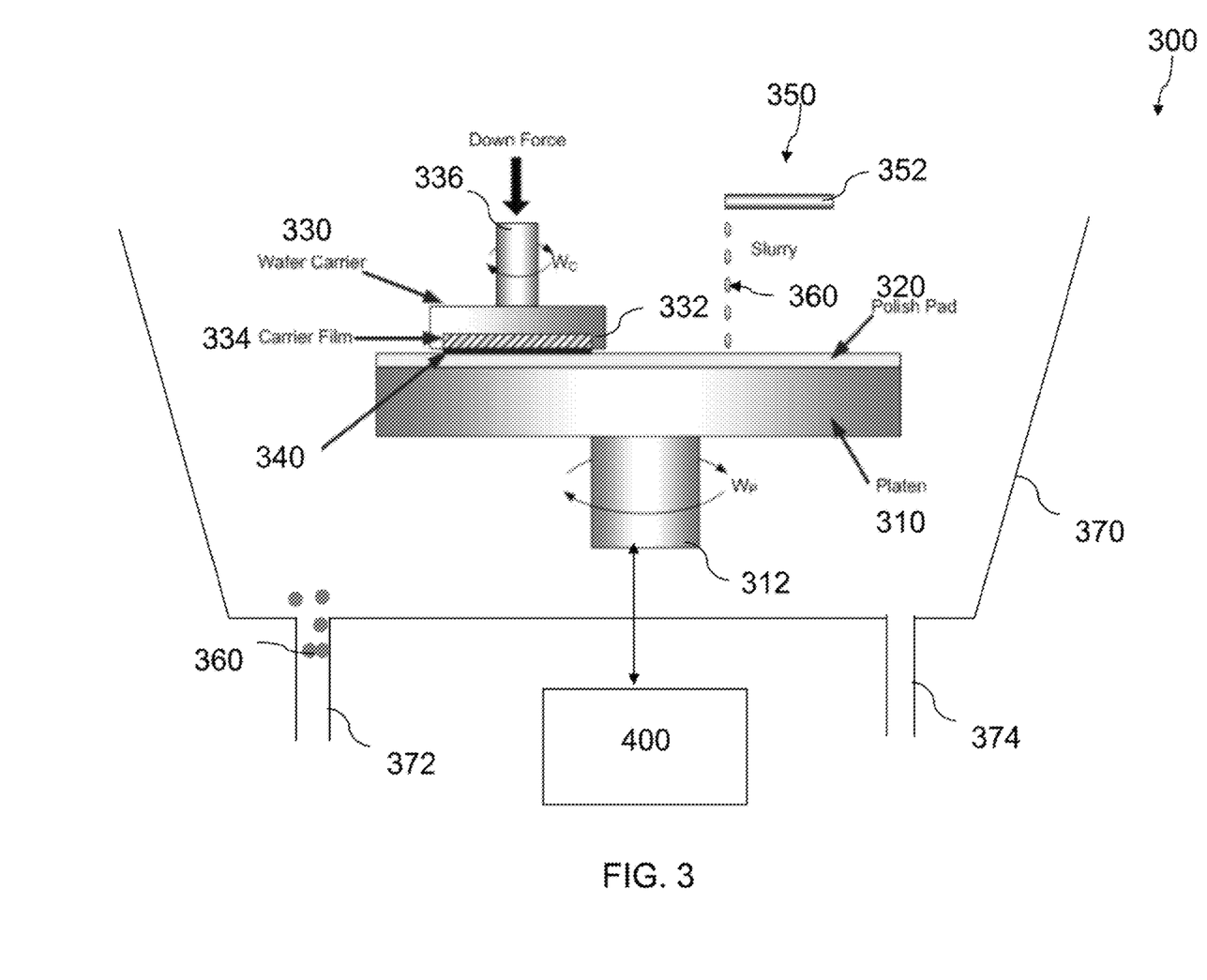
FIG. 3 is a diagram of a chemical mechanical polishing (CMP) system in accordance with some embodiments.

FIG. 3 is a diagram of a CMP system 300, in accordance with some embodiments. Referring to FIG. 3, the CMP system 300 includes a platen 310, a polishing pad 320 on top of the platen 310, and a wafer carrier 330 configured to support a wafer 340 for processing using the CMP system 300. The CMP system 300 further includes a slurry delivery system 350 configured to deliver a CMP slurry 360 of the present disclosure to the polishing pad 320 to facilitate removal of metals from the wafer 340. A drain cup 370 is disposed around the platen 310. A control system 400 is configured to control operation of the CMP system 300. In some embodiments, the CMP system 300 further includes a conditioner (not shown) configured to restore a roughness of polishing pad 320.

The platen 310 is configured to rotate in at least a first direction. In some embodiments, the platen 310 is configured to rotate in more than one direction. In some embodiments, the platen 310 is configured to be held stationary. In some embodiments, the platen 310 is configured to have a constant rotational speed. In some embodiments, the platen 310 is configured to have a variable rotational speed. In some embodiments, the platen 310 is rotated by a motor through a platen spindle 312. In some embodiments, the motor is an alternating current (AC) motor, a direct current (DC) motor, a universal motor, or another suitable motor. In some embodiments, the platen 310 is configured to translate in one or more directions. To be usable to perform CMP processes using the CMP slurry 360 of the present disclosure, the patent 310 and the platen spindle 312 are each made of a material having good chemical resistance to the non-aqueous solvent employed in the CMP slurry 360 of the present disclosure. In some embodiments, the platen 310 and the platen spindle 312 are each made of stainless steel or polyetheretherketone (PEEK).

The polishing pad 320 is configured to connect to the platen 310 so that the polishing pad 320 rotates in a same direction at a same speed at the platen 310. In some embodiments where platen 310 is stationary, the polishing pad 320 is held stationary. The polishing pad 320 has a textured surface which is configured to remove materials from the wafer 340 during operation of CMP system 300. The polishing pad 320 is formed of a material that is hard enough to allow abrasive particles in the CMP slurry to mechanically polish wafer 340, which is between the wafer carrier 330 and the polishing pad 320. On the other hand, the polishing pad 320 is soft enough so that the polishing pad 320 does not substantially scratch surfaces of the wafer 340 during the polishing process. To be usable to perform CMP processes using the CMP slurry 360 of the present disclosure, the polishing pad 320 is made of a material having good chemical resistance to the non-aqueous solvent employed in the CMP slurry 360 of the present disclosure. In some embodiments, the polishing pad 320 is made of polyurethane.

The wafer carrier 330 is configured to hold a wafer 340 proximate to the polishing pad 320 during operation of the CMP system 300. In some embodiments, the wafer carrier 330 includes a retaining ring 332. A carrier film 334 inside of the retaining ring 332 attaches the wafer 340 to the wafer carrier 330. The wafer carrier 330 is configured to rotate in a second direction. In some embodiments, the second direction is the same as the first direction. In some embodiments, the second direction is opposite the first direction. In some embodiments, the wafer carrier 330 is configured to rotate at a constant rotational speed. In some embodiments, the wafer carrier 330 is configured to rotate at a variable rotational speed. In some embodiments, the wafer carrier 330 is rotated by a motor through a wafer carrier spindle 336. In some embodiments, the motor is an AC motor, a DC motor, a universal motor, or another suitable motor. In some embodiments, the wafer carrier 330 is held stationary. In some embodiments, the wafer carrier 330 translates relative to polishing pad 320. To be usable to perform CMP processes using the CMP slurry 360 of the present disclosure, the wafer carrier 330, the carrier film 334 and the wafer carrier spindle 336 are each made of a material having good chemical resistance to the non-aqueous solvent employed in the CMP slurry 360 of the present disclosure. In some embodiments, the wafer carrier 330 and the wafer carrier spindle 336 are each made of stainless steel or PEEK, and the carrier film 334 is made of polyurethane.

The slurry delivery system 350 is configured to provide the CMP slurry 360 onto the polishing pad 320. The slurry delivery system 350 includes at least one nozzle configured to deliver the CMP slurry 360 to the polishing pad 320. The slurry delivery system 350 further includes a slurry arm 352 configured to translate a location of nozzle relative to the surface of the polishing pad 320. To be usable to perform CMP processes using the CMP slurry 360 of the present disclosure, the slurry arm 352 is made of a material having good chemical resistance to the non-aqueous solvent employed in the CMP slurry 360 of the present disclosure. In some embodiments, the slurry arm 352 is made of stainless steel or polyurethane.

The drain cup 370 is disposed around a perimeter of platen 310. The drain cup 370 is capable of collecting excess CMP slurry 360 that is cast of the polishing pad 320 during CMP processes. A drain pipe 372 is connected to a bottom of the drain cup 370. The excess CMP slurry 360 collected by the drain cup 370 flows through the drain pipe 372 so as to be recovered in a tank. An exhaust pipe 374 is connected to the bottom of the drain cup 370. The exhaust pipe 374 is connected to a pump and is configured to exhaust the non-aqueous solvent outside of the CMP system 300. The drain pipe 372 and the exhaust pipe 374 are each made of a material having good chemical resistance to the non-aqueous solvent employed in the CMP slurry 360 of the present disclosure. In some embodiments, the drain pipe 372 and the exhaust pipe 374 are made of polytetrafluoroethene (PTFE).

When the CMP system 300 is in operation, the slurry arm 352 dispenses the CMP slurry 360 of the present disclosure onto the polishing surface of the polishing pad 320. A motor, under control of the control system 400, then rotates the platen 310 and the polishing pad 320 via platen spindle 312 about a polishing pad axis, as shown by arrows Wp. Another motor, also under control of the control system 400, rotates a wafer 340 housed within the wafer carrier 330 about a wafer axis via a wafer carrier spindle 336, as shown by arrows Wc. While this dual-rotation occurs, the wafer 340 is "pressed" into the CMP slurry 360 and the polishing surface of the polishing pad 320 with a down force applied to the wafer carrier 330. The combined mechanical force and chemical force polishes the surface of the wafer 340 until an endpoint for the CMP operation is reached.

Figure 4:
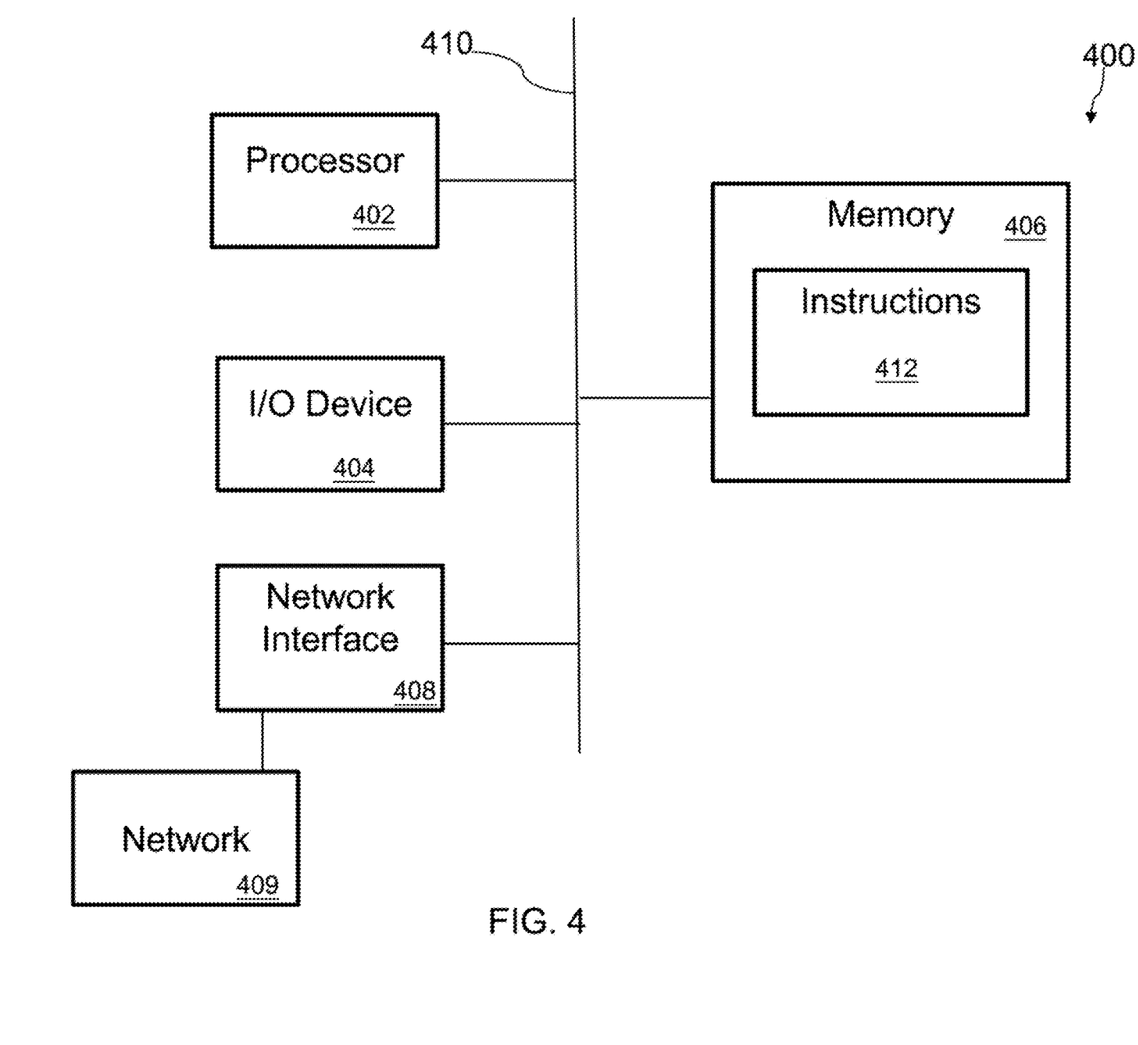
FIG. 4 is a diagram of a control system for controlling operation of a CMP system, in accordance with some embodiments.

FIG. 4 is a block diagram of a control system 400 for controlling operation of a CMP system, in accordance with one or more embodiments. The control system 400 generates output control signals for controlling operation of one or more components of CMP system 300, in accordance with some embodiments. The control system 400 receives input signals from one or more components of the CMP system 300, in accordance with some embodiments. In some embodiments, the control system 400 is located adjacent to the CMP system 300. In some embodiments, the control system 400 is remote from the CMP system 300.

The control system 400 includes a processor 402, an input/output (I/O) device 404, a memory 406, and a network interface 408 each communicatively coupled via a bus 410 or other interconnection communication mechanism.

The processor 402 is arranged to execute and/or interpret one or more set of instructions 412 stored in the memory 406. In some embodiments, the processor 402 is a central processing unit (CPU), a multi-processor, a distributed processing system, an application specific integrated circuit (ASIC), and/or a suitable processing unit.

The I/O interface 404 is coupled to external circuitry. In some embodiments, the I/O interface 404 includes a keyboard, keypad, mouse, trackball, trackpad, and/or cursor direction keys for communicating information and commands to the processor 402.

The memory 406 (also referred to as a computer-readable medium) includes a random access memory or other dynamic storage device, communicatively coupled to the bus 410 for storing data and/or instructions for execution by the processor 402. In some embodiments, the memory 406 is used for storing temporary variables or other intermediate information during execution of instructions to be executed by the processor 402. In some embodiments, the memory 406 also includes a read-only memory or other static storage device coupled to the bus 410 for storing static information and instructions for the processor 402. In some embodiments, the memory 406 is an electronic, magnetic, optical, electromagnetic, infrared, and/or a semiconductor system (or apparatus or device). For example, the memory 406 includes a semiconductor or solid-state memory, a magnetic tape, a removable computer diskette, a random access memory (RAM), a read-only memory (ROM), a rigid magnetic disk, and/or an optical disk. In some embodiments using optical disks, the memory 406 includes a compact disk-read only memory (CD-ROM), a compact disk-read/write (CD-R/W), and/or a digital video disc (DVD).

The memory 406 is encoded with, i.e., storing, the computer program code, i.e., a set of executable instructions 412, for controlling one or more components of the CMP system 300 and causing the control system 400 to perform the CMP processes. In some embodiments, the memory 406 also stores information needed for performing the CMP processes as well as information generated during performing the CMP process.

The network interface 408 includes a mechanism for connecting to a network 409, to which one or more other computer systems are connected. In some embodiments, the network interface 408 includes a wired and/or wireless connection mechanism. The network interface 408 includes wireless network interfaces such as BLUETOOTH, WIFI, WIMAX, GPRS, or WCDMA; or wired network interface such as ETHERNET, USB, or IEEE-1394. In some embodiments, the control system 400 is coupled with one or more components of the CMP system 300 via the network interface 408. In some embodiments, the control system 400 is directly coupled with one or more components of the CMP system 300, e.g., with the components coupled to the bus 410 instead of via the network interface 408.

Figure 5:
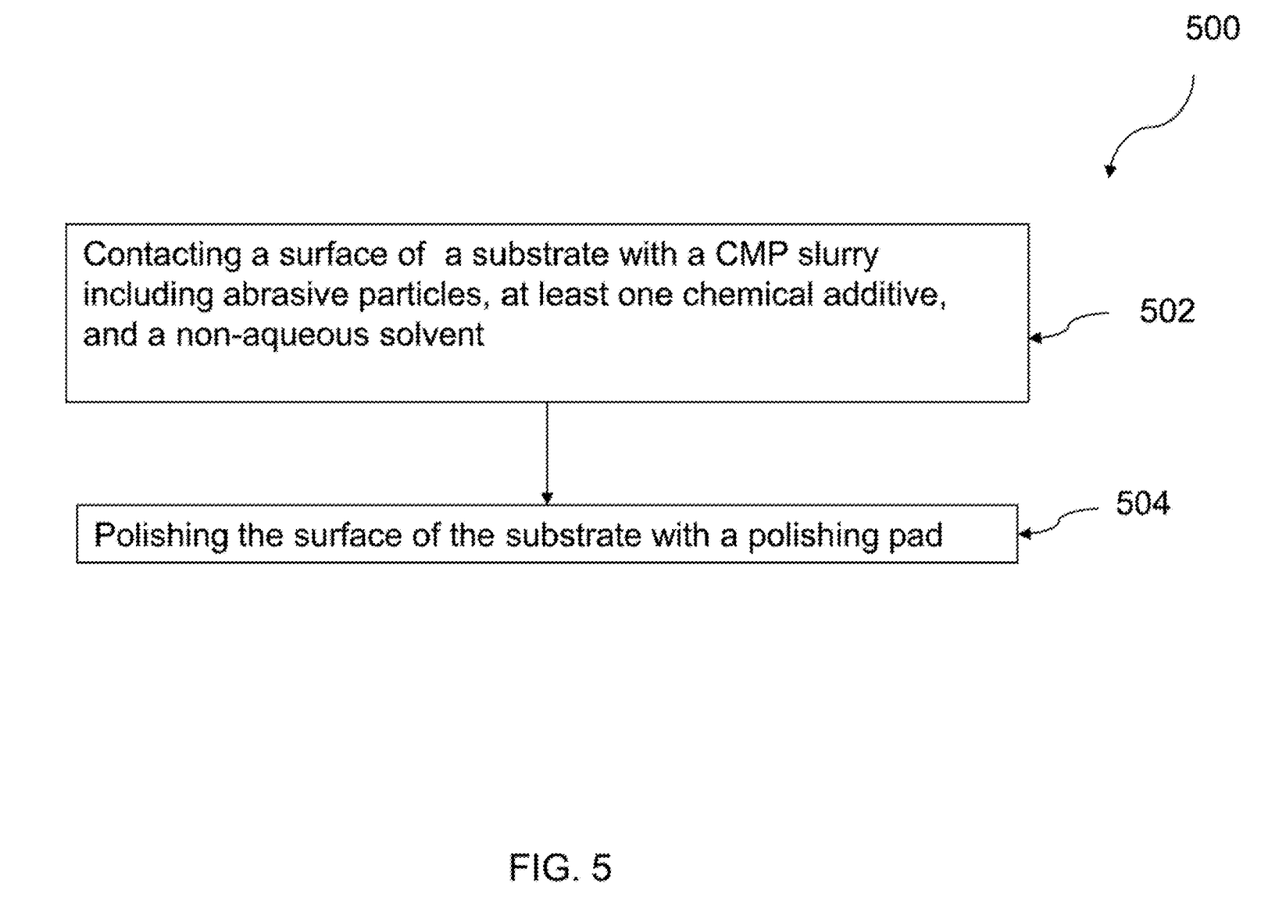
FIG. 5 is a flowchart of a method for performing a CMP process, in accordance with some embodiments.

FIG. 5 is a flowchart of a method 500 for performing a CMP process, in accordance with some embodiments. During the CMP process, a surface of a substrate, e.g., wafer 340, is polished a CMP system, e.g., CMP system 300 (FIG. 3). At operation 502, a surface of the wafer 340 is contacted with a CMP slurry 360 of the present disclosure. At operation 504, the surface of the wafer 340 is polished with a polishing pad, e.g., polishing pad 320. In some embodiments, the surface of the wafer 340 includes surfaces of a barrier layer (e.g., barrier layer 214/224) and a conductive material layer (e.g., conductive material layer 216/226) (FIGS. 2B and 2E).

One aspect of this description relates to a polishing composition for chemical mechanical polishing. The polishing slurry includes abrasive particles, at least one chemical additive, and a non-aqueous solvent. In some embodiments, the non-aqueous solvent includes a glycol, a glycerin, a sulfoxide, or a mixture thereof. In some embodiments, the non-aqueous solvent includes ethylene glycol or dimethyl sulfoxide (DMSO). In some embodiments, the abrasive particles include silica, alumina, ceria, titania, zirconia, magnesia, or manganese oxide. In some embodiments, the abrasive particles include colloidal silica or colloidal ceria. In some embodiments, the at least one chemical additive includes an oxidizing agent, a chelating agent, a corrosion inhibitor, or a pH adjusting agent. In some embodiments, the oxidizing agent includes hydrogen peroxide, peroxosulfates, nitric acid, potassium periodate, hypochlorous acid, ozone, ferric nitrate, potassium nitrate, or combinations thereof. In some embodiments, the chelating gent includes phosphoric acid, acetic acid, oxalic acid, malonic acid, tartaric acid, citric acid, maleic acid, phthalic acid, ethanol amine, or propanol amine. In some embodiments, the corrosion inhibitor includes a pyridine or an azole derivative. In some embodiments, the pH adjusting agent includes at least one acid or at least one base. In some embodiments, a pH of the polishing composition is from about 2 to about 11. In some embodiments, a concentration of the abrasive particles in the polishing composition is about 10 wt. % or less.

Another aspect of this description relates to a method for performing a chemical mechanical polishing process. The method includes contacting a surface of a substrate with a polishing composition. The polishing composition includes abrasive particles, at least one chemical additive, and a non-aqueous solvent. The method further includes polishing the surface of the substrate with a polishing pad. In some embodiments, contacting the surface of the substrate with the polishing composition includes contacting a surface of a barrier layer and a surface of a conductive material layer with the polishing composition.

Still another aspect of this description relates to a method of forming a semiconductor structure. The method includes etching a dielectric layer over a substrate to form a contact opening, depositing a barrier layer over sidewalls and a bottom of the contact opening and over a top surface of the dielectric layer, depositing a conductive material layer over the barrier layer to fill the contact opening, and performing a chemical mechanical polishing (CMP) process to remove portions of the barrier layer and the conductive material layer over the top surface of the dielectric layer. Performing the CMP process includes contacting the barrier layer and the conductive material layer with a polishing composition. The polishing composition includes abrasive particles, at least one chemical additive, and a non-aqueous solvent. In some embodiments, depositing the barrier layer includes depositing the barrier layer including titanium (Ti), titanium nitride (TiN), tantalum (Ta), tantalum nitride (TaN), ruthenium (Ru), tungsten nitride (WN), Ti/TiN, or Ta/TaN. In some embodiments, depositing the conductive material layer includes depositing the conductive material layer comprising copper, aluminum, tungsten, cobalt, or alloys thereof. In some embodiments, the method further includes, after the CMP process, performing a cleaning process on surfaces of remaining portions of the barrier layer and the conductive material layer within the contact opening. In some embodiments, performing the cleaning process comprises applying a cleaning solution to the surfaces of the remaining portions of the barrier layer and the conductive material layer. The cleaning solution includes at least one chemical and a non-aqueous solvent. In some embodiments, the polishing composition causes no galvanic reaction between the remaining portions of the conductive material layer and a barrier material of the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A polishing composition for a chemical mechanical polishing process, the polishing composition consisting of:
    abrasive particles present in an amount from about 0.01% to about 10% by weight;
    an oxidizing agent;
    a chelating agent;
    a corrosion inhibitor; and
    a pH adjusting agent; and
    a non-aqueous solvent in an amount sufficient to disperse the abrasive particles, the chelating agent, the corrosion inhibitor and the pH adjusting agent, wherein the non-aqueous solvent is selected from the group consisting of a glycol, a glycerin and a sulfoxide.

2. The polishing composition of claim 1, wherein the non-aqueous solvent is ethylene glycol or dimethyl sulfoxide (DMSO).

3. The polishing composition of claim 1, wherein the abrasive particles comprise silica, alumina, ceria, titania, zirconia, magnesia, or manganese oxide.

4. The polishing composition of claim 1, wherein the abrasive particles comprise colloidal silica or colloidal ceria.

5. The polishing composition of claim 1, wherein the oxidizing agent comprises hydrogen peroxide, peroxosulfates, nitric acid, potassium periodate, hypochlorous acid, ozone, ferric nitrate, potassium nitrate, or combinations thereof.

6. The polishing composition of claim 1, wherein the chelating gent comprises phosphoric acid, acetic acid, oxalic acid, malonic acid, tartaric acid, citric acid, maleic acid, phthalic acid, ethanol amine, or propanol amine.

7. The polishing composition of claim 1, wherein the corrosion inhibitor comprises a pyridine or an azole derivative.

8. The polishing composition of claim 1, wherein the pH adjusting agent comprises at least one acid or at least one base.

9. The polishing composition of claim 1, wherein a pH of the polishing composition is from about 2 to about 11.

10. A method of for performing a chemical mechanical polishing process, comprising:
    contacting a surface of a substrate with a non-aqueous polishing composition, the non-aqueous polishing composition consisting of:

abrasive particles present in an amount from about 0.01% to about 10% by weight;

an oxidizing agent present in an amount from about 0.01% to about 10% by weight;

a chelating agent present in an amount from about 0.01% to about 10% by weight;

a corrosion inhibitor present in an amount from about 0.01% to about 10% by weight;

a pH adjusting agent present in an amount from about 0.01% to about 10% by weight; and a non-aqueous solvent in an amount sufficient to disperse the abrasive particles, the chelating agent, the corrosion inhibitor and the pH adjusting agent, wherein the non-aqueous is selected from the group consisting of a glycol, a glycerin and a sulfoxide;

polishing the surface of the substrate with a polishing pad.

11. The method of claim 10, wherein contacting the surface of the substrate with the polishing composition comprises contacting a surface of a barrier layer and a surface of a conductive material layer with the polishing composition.

12. A method of forming a semiconductor structure, comprising:

etching a dielectric layer over a substrate to form a contact opening;

depositing a barrier layer over sidewalls and a bottom of the contact opening and over a top surface of the dielectric layer, the barrier layer comprising a first metal;

depositing a conductive material layer over the barrier layer to fill the contact opening, the conductive material layer comprising a second metal different from the first metal; and performing a chemical mechanical polishing (CMP) process to remove portions of the barrier layer and the conductive material layer over the top surface of the dielectric layer, wherein performing the CMP process comprises contacting the barrier layer and the conductive material layer with a polishing composition, the polishing composition consisting of abrasive particles, an oxidizing agent, a chelating agent, a corrosion inhibitor, a pH adjusting agent and a non-aqueous solvent in an amount sufficient to disperse the abrasive particles, the chelating, agent, the corrosion inhibitor and the pH adjusting agent, wherein the non-aqueous solvent is selected from the group consisting of a glycol, a glycerin and a sulfoxide, and wherein the polishing composition is substantially free of water such that no galvanic reaction is occurred between the first metal and the second metal during the CMP process due to the presence of water.

13. The method of claim 12, wherein depositing the barrier layer comprises depositing the first metal comprising titanium (Ti), titanium nitride (TiN), tantalum (Ta), tantalum nitride (TaN), ruthenium (Ru), tungsten nitride (WN), Ti/TiN, or Ta/TaN.

14. The method of claim 12, wherein depositing the conductive material layer comprises depositing the second metal comprising copper, aluminum, tungsten, cobalt, or alloys thereof.

15. The method of claim 12, further comprising, after the CMP process, performing a cleaning process on surfaces of remaining portions of the barrier layer and the conductive material layer within the contact opening.

16. The method of claim 15, wherein performing the cleaning process comprises applying a cleaning solution to the surfaces of the remaining portions of the barrier layer and the conductive material layer, wherein the cleaning solution comprises at least one chemical and a non-aqueous solvent.

17. The method of claim 16, wherein the at least one chemical comprises an oxidizing agent, a chelating agent, a corrosion inhibitor, or a pH adjusting agent.

18. The method of claim 16, wherein in the polishing composition, the abrasive particles is present in an amount from about 0.01% to about 10% by weight, the chelating agent is present in an amount from about 0.01% to about 10% by weight, the corrosion inhibitor is present in an amount from about 0.01% to about 10% by weight, and the pH adjusting agent present in an amount from about 0.01% to about 10% by weight, with the remainder being the non-aqueous solvent.

19. The method of claim 12, wherein the non-aqueous solvent is ethylene glycol or dimethyl sulfoxide.

20. The method of claim 12, wherein the non-aqueous solvent has a flash point from about 30° C. to about 250° C., a boiling point from 80° C. to about 500° C., and a vapor pressure up to 2.3 kPa at 200° C.

* * * * *